United States Patent [19]

Cameron

[11] Patent Number: 4,629,909
[45] Date of Patent: Dec. 16, 1986

[54] FLIP-FLOP FOR STORING DATA ON BOTH LEADING AND TRAILING EDGES OF CLOCK SIGNAL

[75] Inventor: Kelly B. Cameron, Moscow, Id.

[73] Assignee: American Microsystems, Inc., Santa Clara, Calif.

[21] Appl. No.: 662,747

[22] Filed: Oct. 19, 1984

[51] Int. Cl.[4] ............................................. H03K 3/356
[52] U.S. Cl. .................................... 307/279; 307/443; 307/481; 307/269; 307/272 R; 307/291
[58] Field of Search ................. 307/443, 448, 451–453, 307/480–481, 243, 269, 272 R, 272 A, 279, 291; 365/154; 377/78, 79, 81

[56] References Cited

U.S. PATENT DOCUMENTS

| | | |
|---|---|---|
| 3,909,633 | 9/1975 | Hall, II ............................ 307/443 X |
| 3,917,961 | 11/1975 | Reed ................................... 307/243 |
| 4,101,790 | 7/1978 | Ebihara et al. ................. 307/279 X |
| 4,112,506 | 9/1978 | Zibu ................................. 365/154 X |
| 4,390,987 | 6/1983 | Best ................................. 307/243 X |
| 4,495,628 | 1/1985 | Zasio ......................... 307/272 A X |
| 4,506,167 | 3/1985 | Little et al. ................. 307/272 A X |

Primary Examiner—Stanley D. Miller
Assistant Examiner—D. R. Hudspeth
Attorney, Agent, or Firm—Alan H. MacPherson; Steven F. Caserza; Nathan N. Kallman

[57] ABSTRACT

A flip-flop stores input data on both the leading and trailing edges of a clock pulse. The flip-flop includes a data path responsive to the leading edge of a clock pulse and a second data path responsive to the trailing edge of a clock pulse, thereby allowing data to be stored on both the leading edge and the trailing edge of a clock pulse.

5 Claims, 38 Drawing Figures

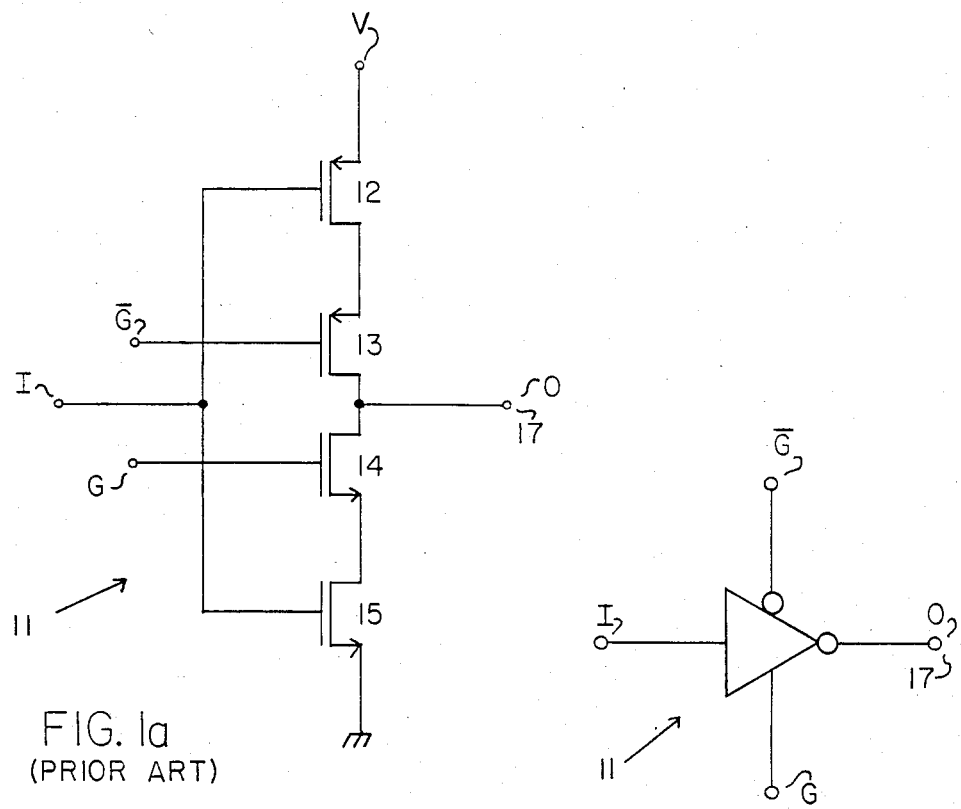
FIG. 1a
(PRIOR ART)
FIG. 1b
(PRIOR ART)
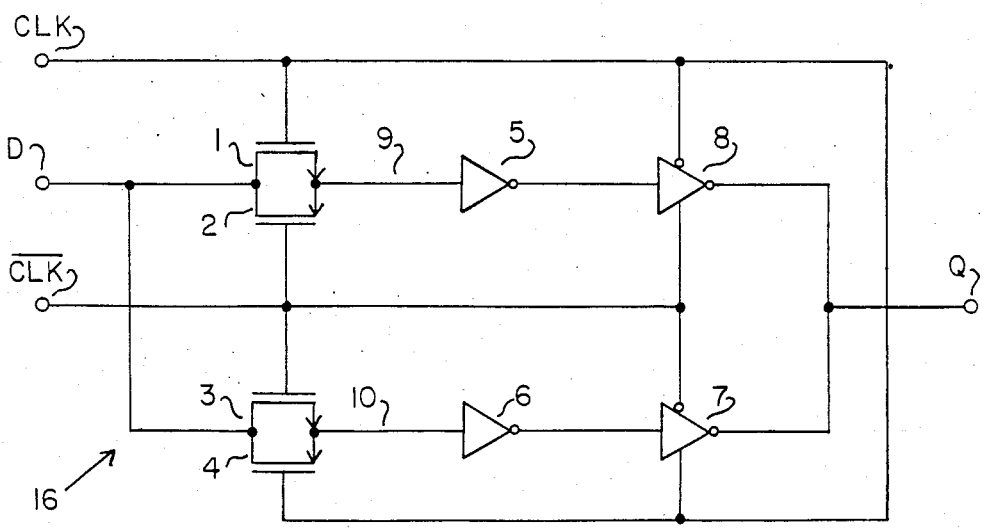
FIG. 2

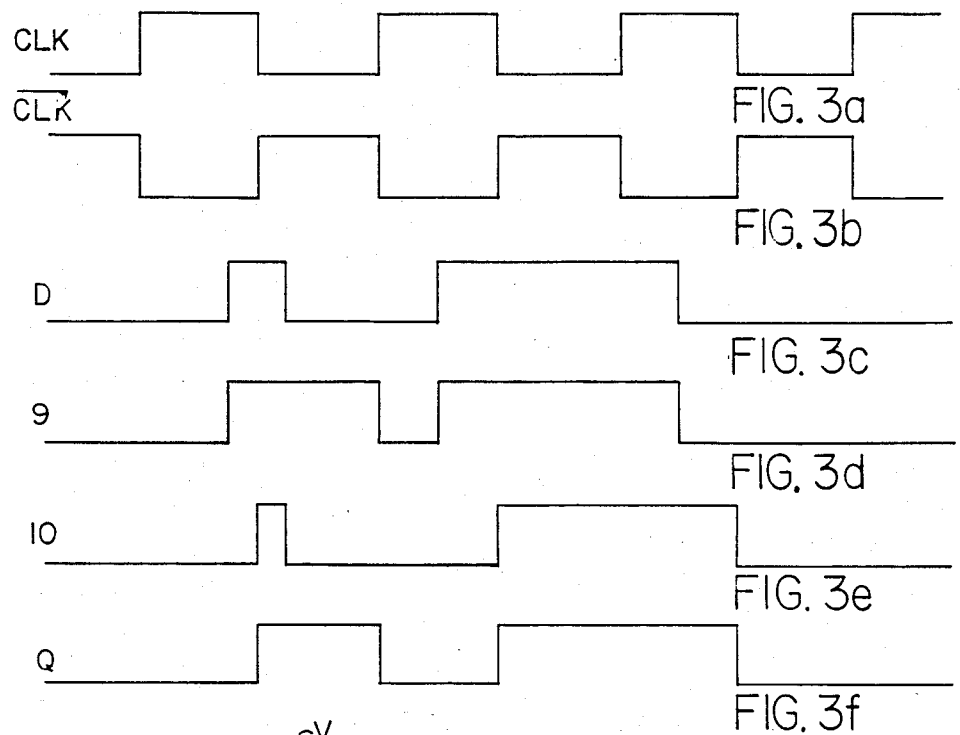
FIG. 3a
FIG. 3b
FIG. 3c
FIG. 3d
FIG. 3e
FIG. 3f
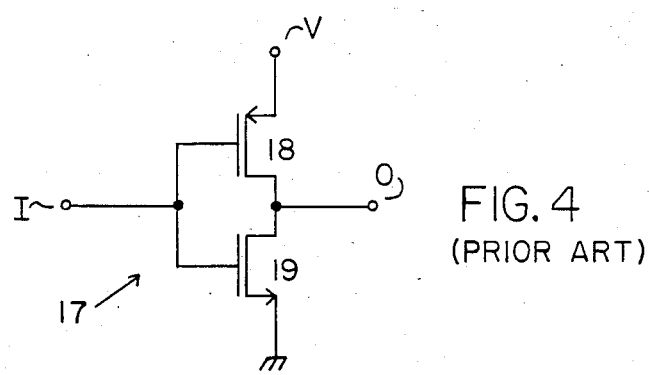
FIG. 4
(PRIOR ART)
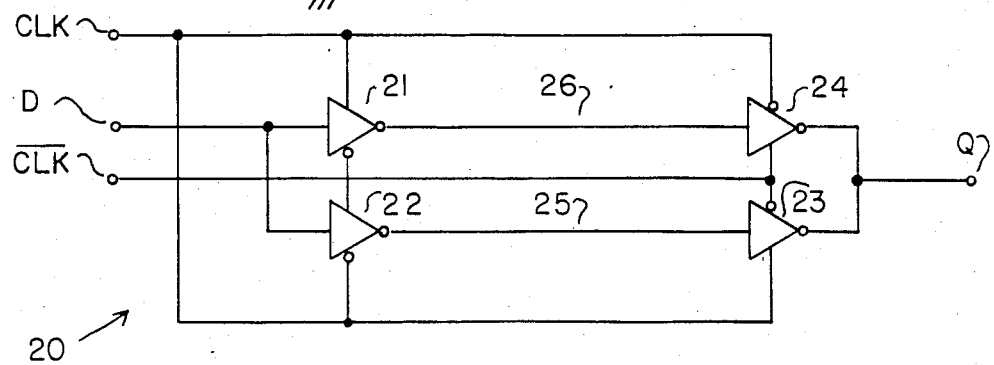
FIG. 5

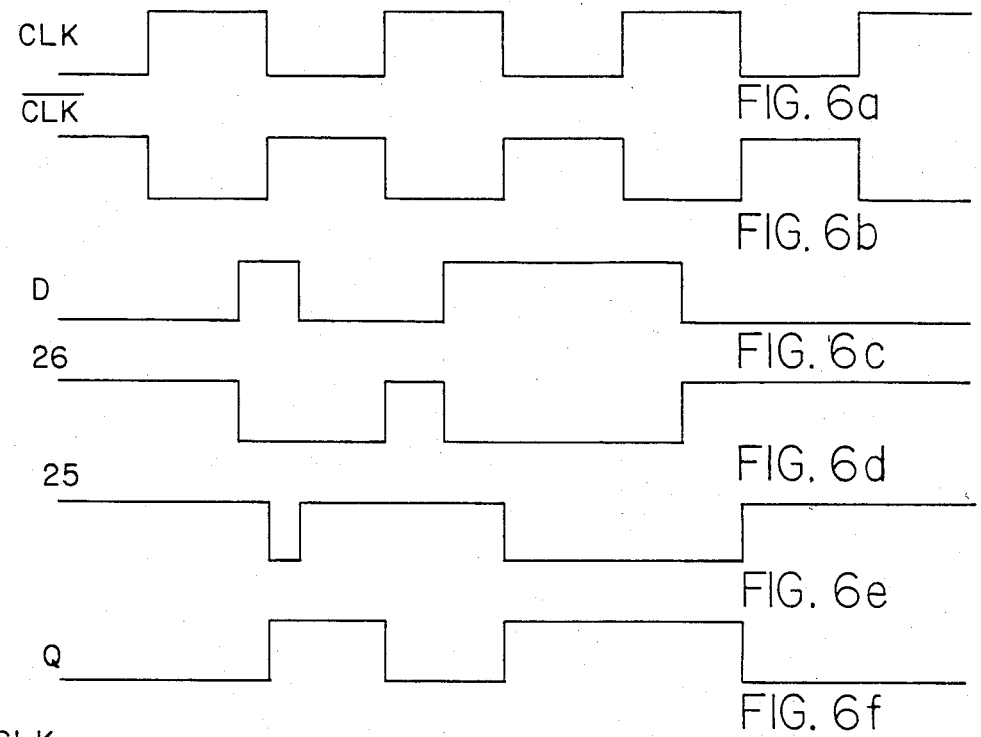
FIG. 6a
FIG. 6b
FIG. 6c
FIG. 6d
FIG. 6e
FIG. 6f
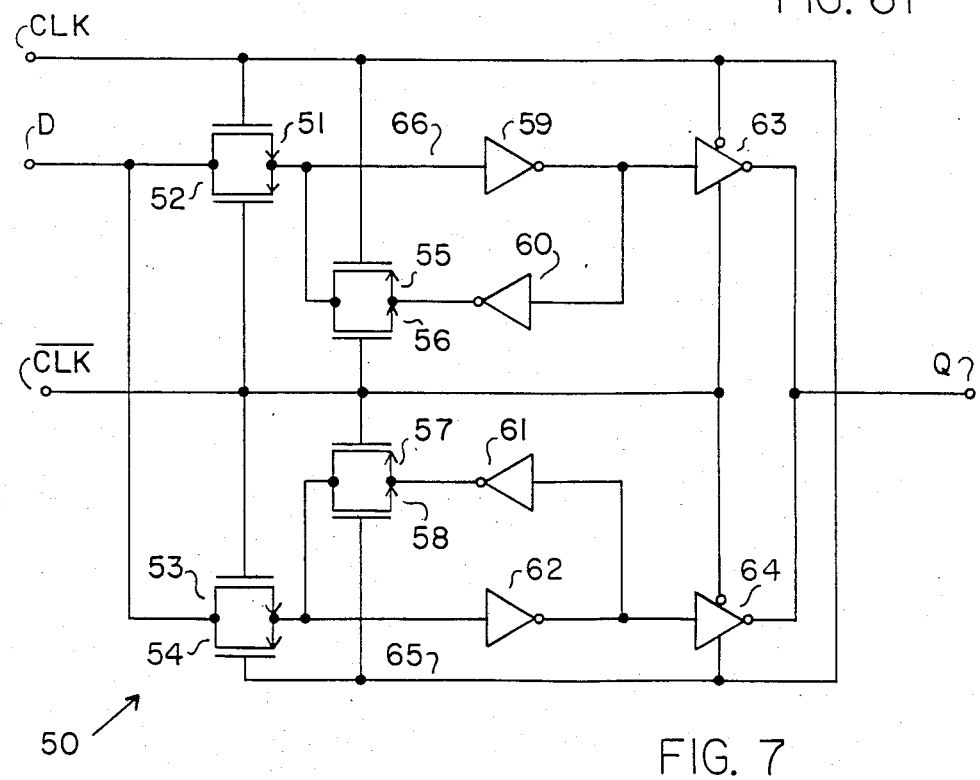
FIG. 7

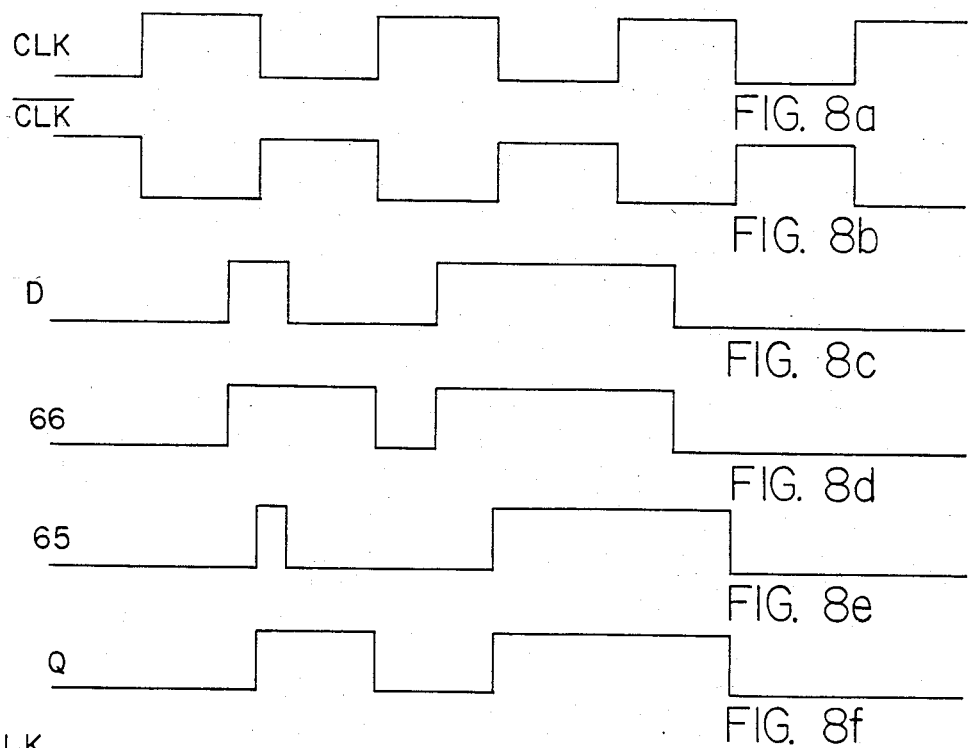
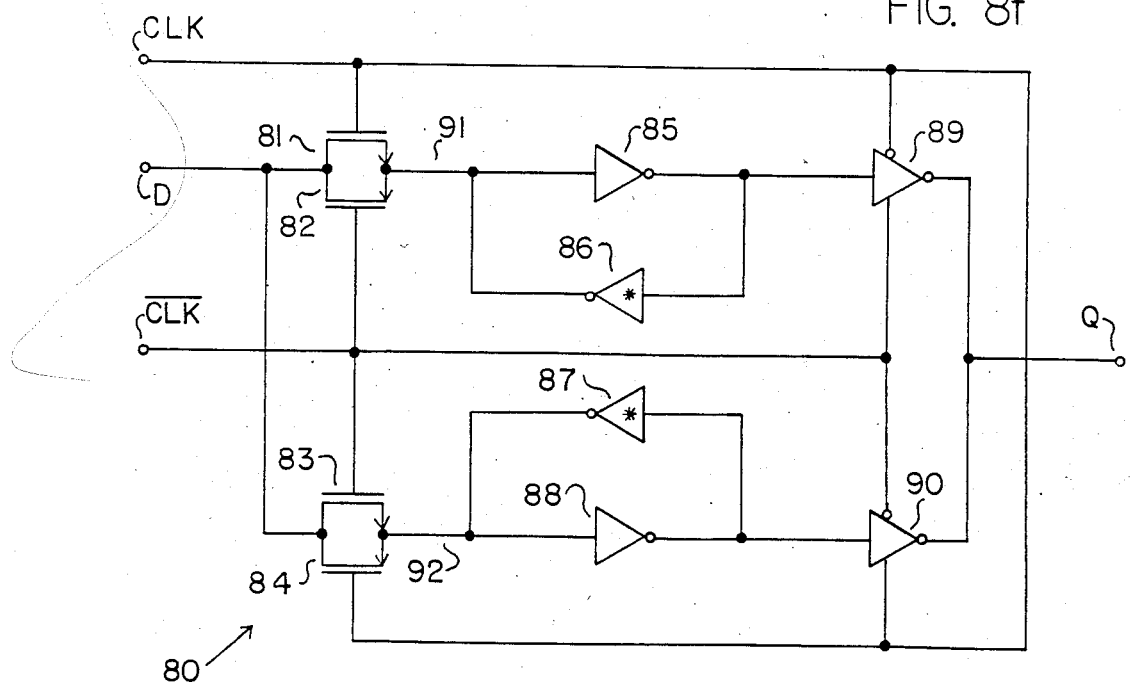
FIG. 9

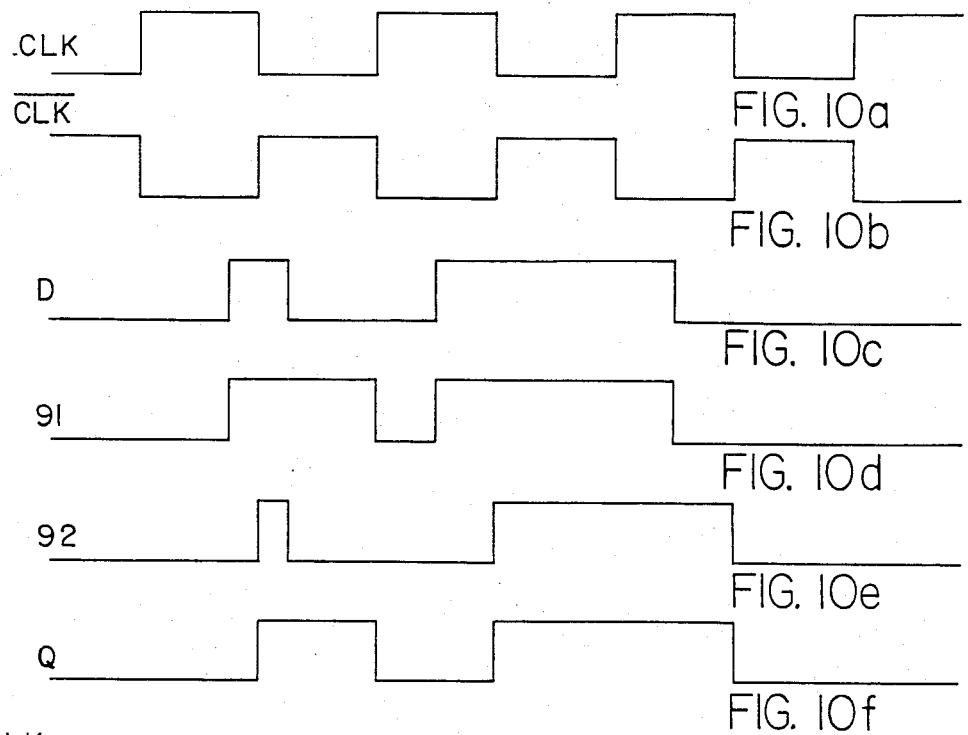
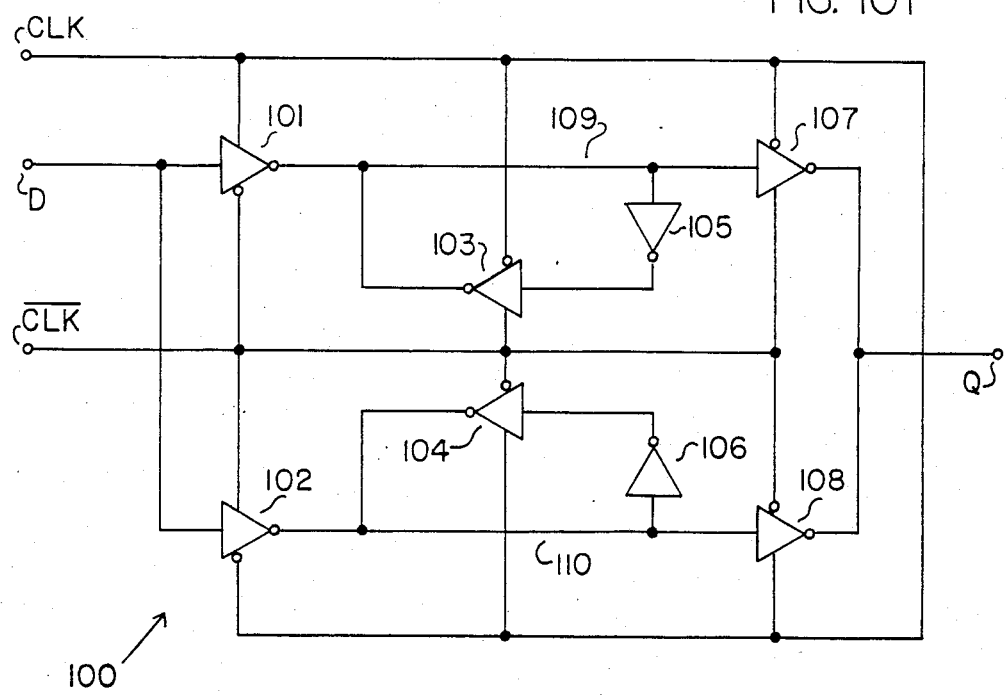
FIG. 11

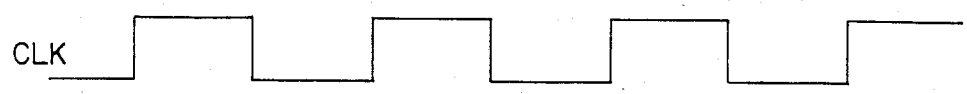
CLK
$\overline{\text{CLK}}$
FIG. 12a
FIG. 12b
D
109
FIG. 12c
110
FIG. 12d
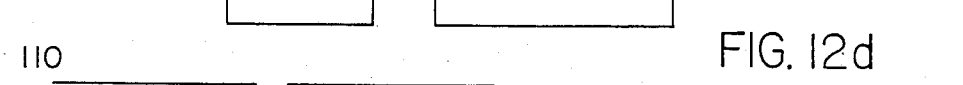
FIG. 12e
Q
FIG. 12f

FLIP-FLOP FOR STORING DATA ON BOTH LEADING AND TRAILING EDGES OF CLOCK SIGNAL

BACKGROUND OF INVENTION

This invention relates to bistable logical elements and specifically to bistable multivibrators generally known as flip-flops.

A flip-flop is a bistable electronic circuit which stores a selected logical state in response to a clock pulse and one or more data input signals. Most flip-flops are designed to store the logical state represented by an input signal present when a leading edge of a clock pulse is received. Conventionally, the leading edge of a clock pulse is that portion of the clock pulse waveform which changes from a low level to a high level. A typical flip-flop using metal oxide semiconductor (MOS) technology is shown in Holt, *Electronic Circuits Digital and Analog*, page 265 (1978), which is hereby incorporated by reference. Other prior art flip-flops store the logical state indicated by an input signal on receipt of the trailing edge of a clock pulse. The trailing edge of a clock pulse is that time when the clock pulse changes from a high level to a low level. An example of a flip-flop capable of changing its logical state on the trailing edge of a clock signal is shown in Hepworth, et al., U.S. Pat. No. 3,976,949, "Edge Sensitive Set-Preset Flip-flop", issued Aug. 24, 1976. Flip-flops which store data either on the leading edge or the trailing edge of the clock signal are limited in that they can only store one logical state per clock pulse. Therefore, it is desirable to provide a flip-flop which stores logical information at a rate faster than once per clock pulse.

SUMMARY

A flip-flop constructed in accordance with this invention stores data on both the leading edge and the trailing edge of a clock pulse. A flip-flop constructed in accordance with this invention includes a first data path responsive to the leading edge of the clock signal and a second data path responsive to the trailing edge of the clock signal, thereby allowing data to be stored on both the leading edge and the trailing edge of the clock signal. A gated inverter is used to provide data control and output buffering.

BRIEF DESCRIPTION OF THE DRAWING

FIG. 1a is a schematic diagram of a prior art gated inverter;

FIG. 1b is a logic symbol for gated inverter 11 of FIG. 1a;

FIG. 2 is a schematic diagram of one embodiment of a flip-flop constructed in accordance with this invention;

FIGS. 3a through 3f are voltage versus time diagrams of voltage levels of circuit 16 in FIG. 2;

FIG. 4 is a schematic diagram of a prior art CMOS inverter;

FIG. 5 is a schematic diagram of another embodiment of a flip-flop constructed in accordance with this invention;

FIGS. 6a through 6f are voltage versus time diagrams illustrating the operation of circuit 20 in FIG. 5;

FIG. 7 is a schematic diagram of another embodiment of a flip-flop constructed in accordance with this invention;

FIGS. 8a through 8f are voltage versus time diagrams illustating the operation of circuit 50 in FIG. 7;

FIG. 9 is a schematic diagram of another embodiment of a flip-flop constructed in accordance with this invention;

FIGS. 10a through 10f are voltage versus time diagrams illustrating the operation of circuit 90 in FIG. 9;

FIG. 11 is a schematic diagram of another embodiment of a flip-flop design in accordance with this invention; and FIGS. 12a through 12f are voltage versus time diagrams illustrating the operation of circuit 100 in FIG. 11.

DETAILED DESCRIPTION

FIG. 1a is a schematic diagram of a prior art gated inverter suitable for use in the described embodiments of this invention. When gating signal G is logical 1 (high voltage level), and thus gating signal $\overline{G}$ is a logical 0 (low voltage level), P channel transistor 13 and N channel transistor 14 are on. When transistors 13 and 14 are on, output signal O is a logical 1 in response to a logical 0 input signal I, and output signal O is a logical 0 in response to a logical 1 input signal I. When gating signal G is a logical 0, and thus gating signal $\overline{G}$ is a logical 1, transistors 13 and 14 are off. Therefore gated inverter 11 provides a high impedance on output terminal 17 and can neither source nor sink current. FIG. 1b is a logic symbol for gated inverter 11 of FIG. 1a. The symbol in FIG. 1b is used throughout this specification to indicate a gated inverter such as gated inverter 11 of FIG. 1a.

A schematic diagram of one embodiment of a dynamic flip-flop constructed in accordance with the teachings of the present invention is shown in FIG. 2. A dynamic flip-flop is a flip-flop which stores a logical signal for a limited amount of time. Therefore, flip-flop 16 is appropriate for use in those applications where flip-flop 16 stores a continuous stream of logical input signals. FIGS. 3a through 3f are voltage versus time diagrams depicting clock signal CLK and $\overline{CLK}$, data input signal D, the signal on lead 9, the signal on lead 10, and output signal Q, respectively. Data input signal D shown in FIG. 3c is a randomly chosen data input signal. When clock signal CLK is a logical 1, and thus clock signal $\overline{CLK}$ is a logical 0, N channel transistor 1 and P channel transistor 2 are on and the transmission gate formed by transistors 1 and 2 conducts the D input signal to lead 9. When clock signal CLK is a logical 0 and therefore clock signal $\overline{CLK}$ is a logical 1, transistors 1 and 2 are off and the transmission gate formed by transistors 1 and 2 does not conduct. Transistors 3 and 4 operate in a similar manner to transistors 1 and 2 except that the gate of transistor 3 is connected to clock signal $\overline{CLK}$ and the gate of transistor 4 is connected to clock signal CLK. Therefore, the transmission gate formed by transistors 3 and 4 conducts when the transmission gate formed by transistors 1 and 2 does not conduct and vice versa.

As shown in FIG. 3d, when clock signal CLK is a logical 1 and clock signal $\overline{CLK}$ is a logical 0, the signal on lead 9 is equal to input signal D. Inverter 5 in FIG. 2 is a typical complementary metal oxide semiconductor (CMOS) inverter, such as is shown in FIG. 4. The time constant of the input lead of inverter 5 is large, due to the high input impedance of transistors 18 and 19. Thus when clock signal CLK goes from a logical 1 to a logical 0 the charge on the gates of transistors 18 and 19 in inverter 5 has no path to discharge and the signal on lead 9 retains the same voltage as the signal had on lead 9 immediately prior to clock signal CLK going from a logical 1 to a logical 0.

When clock signal CLK is a logical 0 (and thus clock signal $\overline{CLK}$ is a logical 1), gated inverter 8 (FIG. 2) is enabled. Therefore, the signal on lead 9 is inverted once by inverter 5 and inverted once again by gated inverter 8 to provide an output signal Q which is equivalent to the signal on lead 9. Thus, transistors 1 and 2, lead 9, inverter 5, and gated inverter 8 store input signal D on the trailing edge of clock signal CLK. The signal stored by the charge on the gates of transistors 18 and 19 in inverter 5 dissipates over time. Therefore, flip-flop 16 is only capable of storing signals over a short period of time (approximately 20 microseconds at 85° C.).

Transistors 3 and 4, lead 10, inverter 6, and gated inverter 7 operate in the same manner as transistors 1 and 2, lead 9, inverter 5, and gated inverter 8, respectively, except that transistors 3 and 4 are on when clock signal $\overline{CLK}$ is a logical 1 and clock signal CLK is a logical 0, and gated inverter 7 is enabled when clock signal $\overline{CLK}$ is a logical 0 and clock signal CLK is a logical 1. Thus transistors 3 and 4, lead 10, inverter 6, and gated inverter 7 store input signal D on the leading edge of clock signal CLK. Therefore flip-flop 16 stores the input signal D, and provides an output signal Q in response thereto, on both the leading edge and the trailing edge of a clock pulse provided by clock signal CLK.

FIG. 5 is a schematic diagram of another embodiment of a dynamic flip-flop 20 constructed in accordance with the teachings of the present invention. Flip-flop 20 uses gated inverters 21 and 22 to replace the transmission gates and inverters (1, 2, 5; 3, 4, 10) used in flip-flop 16 of FIG. 2. When clock signal CLK is a logical 1 and clock signal $\overline{CLK}$ is a logical 0, gated inverter 21 provides the inverse of input signal D on lead 26. When clock signal CLK goes from a logical 1 to a logical 0 and clock signal $\overline{CLK}$ goes from a logical 0 to a logical 1, the signal provided on lead 26 is stored because the charge on the gates of the input transistors of gated inverter 24 has no path by which to discharge. Therefore when clock signal CLK is a logical 0 and clock signal $\overline{CLK}$ is a logical 1, gated inverter 24 provides a Q output signal which is the inverse of signal stored on the gates of the input transistors of gated inverter 24. Therefore, at the trailing edge of a clock pulse provided by clock signal CLK, the Q output signal is equal to input signal D.

Gated inverter 22, lead 25, and gated inverter 23 operate in the same manner as gated inverter 21, lead 26, and gated inverter 24, respectively, except that gated inverter 22 is on when clock signal $\overline{CLK}$ is a logical 1 and clock signal CLK is a logical 0 and gated inverter 23 is on when clock signal $\overline{CLK}$ is a logical 0 and clock signal CLK is a logical 1. Therefore, at the leading edge of clock signal CLK gated inverter 23 provides an output signal which is equivalent to input signal D. Therefore flip-flop 20 provides at the leading and trailing edges of a clock pulse provided by clock signal CLK an output signal Q which is equivalent to input signal D. FIGS. 6a through 6f are voltage versus time diagrams of clock signals CLK and $\overline{CLK}$, the D input signal, the signals on leads 26 and 25, and the Q output signal, respectively, illustrating the operation of circuit 20 in FIG. 5.

FIG. 7 is a schematic diagram of one embodiment of a static flip-flop constructed in accordance with the teachings of the present invention. A static flip-flop is capable of storing data indefinitely. Therefore static flip-flop 50 is particularly well suited to storing signals that are not received as a continuous stream of data but rather are stored over extended periods of time. Transistors 51 and 52, lead 66, inverter 59, and gated inverter 63 function in the same manner as transistors 1 and 2, lead 9, inverter 5, and gated inverter 8 of FIG. 2. The transmission gate formed by transistors 55 and 56 is on when clock signal CLK is a logical 0 and clock signal $\overline{CLK}$ is a logical 1. Conversely, the transmission gate formed by transistors 51 and 52 is on when clock signal CLK is a logical 1 and clock signal $\overline{CLK}$ is a logical 0. Therefore, the transmission gate formed by transistors 55 and 56 is on when the transmission gate formed by transistors 51 and 52 is off and vice versa. The input lead of inverter 60 is connected to the output lead of inverter 59. Therefore, inverter 60 provides an output signal which is equivalent to the signal on lead 66. Thus when transistors 55 and 56 are on, inverter 60 provides an output signal which maintains on lead 66 a signal equivalent to input signal D at the trailing edge of clock signal CLK, rather than relying on the charge stored on the gates of the input transistors of inverter 59, as was done in the dynamic flip-flops of FIGS. 2 and 5 with respect to inverters 5 and 24, respectively.

Inverter 61 and the transmission gate formed by P channel transistor 57 and N channel transistor 58 function in the same manner as inverter 60 and the transmission gate formed by transistors 55 and 56, respectively, except that the transmission gate formed by transistors 57 and 58 conducts when the transmission gate formed by transistors 55 and 56 does not conduct, and vice versa. When transistors 57 and 58 are on, inverter 61 maintains the signal on lead 65 at a signal equivalent to input signal D at the leading edge of clock signal CLK. Therefore, flip-flop 50 statically stores the equivalent of input signal D at both the leading edge and the trailing edge of a clock pulse provided by clock signal CLK. FIGS. 8a through 8f are voltage versus time diagrams of clock signals CLK and $\overline{CLK}$, input signal D, the signals on leads 66 and 65, and output signal Q, respectively, depicting the operation of static flip-flop 50.

FIG. 9 is a schematic diagram of another embodiment of a static flip-flop 80 constructed in accordance with the teachings of the present invention. Inverters 86 and 87 are provided to maintain the stored data signal on leads 91 and 92, respectively. Inverters 86 and 87 are weak inverters. A weak inverter operates in a similar manner as a normal inverter such as inverter 85 or 88 except that when input signal D is applied to leads 91 or 92 through transistors 81 and 82 or transistors 83 and 84, respectively, input signal D overrides the output signal of inverter 86 or inverter 87, respectively. Thus inverters 86 and 87 provide the same function as inverter 60 and transistors 55 and 56, and inverter 61 and transistors 57 and 58, respectively in FIG. 7. FIGS. 10a through 10f are voltage versus time diagrams of clock signals CLK and $\overline{CLK}$, input signal D, the signals on leads 91 and 92, and output signal Q, respectively, depicting the operation of static flip-flop 80.

FIG. 11 is a schematic diagram of another embodiment of a static flip-flop 100 constructed in accordance with the teachings of the present invention. Gated inverters 101, 107, 102, and 108 operate in the same manner as gated inverters 21, 24, 22, and 23, respectively in flip-flop 20 of FIG. 5. Gated inverter 103 is on when clock signal CLK is a logical 0 and clock signal $\overline{CLK}$ is a logical 1. Conversely, gated inverter 103 is off when clock signal CLK is a logical 1 and clock signal $\overline{\text{CLK}}$ is a logical 0. Therefore, gated inverter 103 is on when gated inverter 101 is off and vice versa. When gated inverter 103 is on, the input signal on the input lead of inverter 105 is inverted once by inverter 105 and once again by gated inverter 103 input signal D at the trailing edge of clock signal CLK. Because gated inverter 103 is on when gated inverter 101 is off, gated inverter 103 provides an output signal on lead 109 which is equivalent to input signal D at the trailing edge of clock signal CLK. Thus the signal on lead 109 is maintained equal to input signal D at the trailing edge of clock signal CLK by gated inverter 103 rather than by the charge stored on the gates of the input transistors of gated inverter 107 as does flip-flop 20 in FIG. 5. Inverter 106 and gated inverter 104 operate in the same manner as inverter 105 and gated inverter 103 except that gated inverter 104 is on when gated inverter 102 is off and vice versa. In summary, gated inverter 107 provides an output signal equivalent to input signal D at the trailing edge of clock signal CLK when clock signal CLK is a logical 0. Gated inverter 108 provides an output signal equivalent to input signal D at the leading edge of clock signal CLK when clock signal CLK is a logical 1. Therefore, flip-flop 100 stores input signal D at both the leading edge and trailing edge of a clock pulse provided by clock signal CLK. FIGS. 12a through 12f are voltage versus time diagrams of clock signals CLK and $\overline{\text{CLK}}$, input signal D, the signals on leads 109 and 110, and output signal Q, respectively, illustrating the operation of circuit 100 in FIG. 11.

The described embodiments of this invention each store an input signal on both the leading and trailing edges of a clock pulse, thus providing a data transfer rate double that of prior art flip-flops using the same clock signal, thereby increasing the speed of circuits using the described embodiments while avoiding the problems inherent in doubling the clock frequency (e.g., propagation errors, parasitic capacitance effects, etc.). Also, at times, due to system considerations, a clock having twice the basic clock frequency may not be available at all. If part of a logic circuit operates at a frequency $f_o$, and part of it at a frequency of $2f_o$ (in order to derive the desired logic function), a serious synchronization problem between the two parts of the circuit can occur (i.e., the phase between the two clocks can become very critical). These problems are avoided by utilizing a flip-flop constructed in accordance with the teachings of this invention.

While this specification illustrates the specific embodiments of this invention, it is not to be interpreted as limiting the scope of the invention. Many embodiments of this invention will become evident to those of ordinary skill in the art in light of the teachings of this specification.

I claim:

1. A flip-flop having a data input terminal for receiving a data input signal, a data output terminal for providing data output signals, and a clock input terminal for receiving a clock input signal, comprising:
   first storage means coupled to said data input terminal and having an output lead connected to said output terminal, wherein said first storage means stores said data input signal when said clock input signal is at a first level and provides said stored data input signal on said output lead while said clock input signal is at a second level; and
   second storage means coupled to said data input terminal and having an output lead connected to said output terminal, wherein said second storage means stores said data input signal when said clock signal is at said second level and provides said stored data input signal on said output lead when said clock signal is at said first level.

2. A flip-flop as in claim 1 wherein said flip-flop is constructed using complementary metal oxide semiconductor technology.

3. A flip-flop having a data input terminal for receiving a data input signal, a data output terminal for providing data output signals, and a clock input terminal for receiving a clock input signal, comprising:
   first storage means coupled to said data input terminal and having an output lead connected to said output terminal, wherein said first storage means stores said data input signal when the leading edge of a clock pulse is provided by said clock input and provides said stored data input signal on said output lead; and
   second storage means coupled to said data input terminal and having an output lead connected to said output terminal, wherein said second storage means stores said data input signal when the trailing edge of a clock pulse is provided by said clock signal and provides said stored data input signal on said output lead.

4. A flip-flop as in claim 3 wherein said flip-flop is constructed using complementary metal oxide semiconductor technology.

5. A flip-flop as in claim 3, including gated inverter means coupled between said data input and data output terminals for providing data control and output signal buffering.

* * * * *